United States Patent
Chien et al.

(10) Patent No.: US 7,170,786 B2
(45) Date of Patent: Jan. 30, 2007

(54) DEEP WORDLINE TRENCH TO SHIELD CROSS COUPLING BETWEEN ADJACENT CELLS FOR SCALED NAND

(75) Inventors: Henry Chien, Manassas, VA (US); Yupin Fong, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 138 days.

(21) Appl. No.: 11/086,648

(22) Filed: Mar. 21, 2005

(65) Prior Publication Data
US 2005/0162927 A1   Jul. 28, 2005

Related U.S. Application Data

(63) Continuation of application No. 10/353,570, filed on Jan. 28, 2003, now Pat. No. 6,898,121, which is a continuation-in-part of application No. 10/175,764, filed on Jun. 19, 2002, now Pat. No. 6,894,930.

(51) Int. Cl.
*G11C 16/04* (2006.01)

(52) U.S. Cl. .......................... 365/185.17; 365/185.18; 365/185.19

(58) Field of Classification Search .......... 365/185.17, 365/185.18, 185.19
See application file for complete search history.

(56) References Cited

U.S. PATENT DOCUMENTS

| | | | |
|---|---|---|---|
| 5,043,940 A | 8/1991 | Harari |
| 5,053,839 A | 10/1991 | Esquivel et al. |
| 5,070,032 A | 12/1991 | Yuan |
| 5,095,344 A | 3/1992 | Harari |
| 5,168,465 A | 12/1992 | Harari |
| 5,172,338 A | 12/1992 | Mehrotra |
| 5,198,380 A | 3/1993 | Harari |
| 5,268,318 A | 12/1993 | Harari |
| 5,268,319 A | 12/1993 | Harari |
| 5,297,148 A | 3/1994 | Harari et al. |
| 5,313,421 A | 5/1994 | Guterman |
| 5,315,541 A | 5/1994 | Harari et al. |
| 5,343,063 A | 8/1994 | Yuan |
| 5,380,672 A | 1/1995 | Yuan |
| 5,471,423 A | 11/1995 | Iwasa |
| 5,512,505 A | 4/1996 | Yuan |
| 5,534,456 A | 7/1996 | Yuan |
| 5,554,553 A | 9/1996 | Harari |
| 5,579,259 A | 11/1996 | Samachisa |
| 5,595,924 A | 1/1997 | Yuan |
| 5,640,032 A | 6/1997 | Tomioka |

(Continued)

FOREIGN PATENT DOCUMENTS

KR   002/0088554   11/2002

OTHER PUBLICATIONS

International Search Report, PCT/US03/18183 filed Sep. 6, 2003.

(Continued)

*Primary Examiner*—Huan Hoang
(74) *Attorney, Agent, or Firm*—Parsons Hsue & de Runtz LLP (57) ABSTRACT

A NAND flash memory structure with a wordline or control gate that provides shielding from Yupin effect errors and generally from potentials in adjacent strings undergoing programming operations with significant variations in potential.

13 Claims, 7 Drawing Sheets

U.S. PATENT DOCUMENTS

| | | | |
|---|---|---|---|
| 5,654,217 | A | 8/1997 | Yuan |
| 5,661,053 | A | 8/1997 | Yuan |
| 5,677,872 | A | 10/1997 | Samachisa |
| 5,680,345 | A | 10/1997 | Hsu et al. |
| 5,712,179 | A | 1/1998 | Yuan |
| 5,712,180 | A | 1/1998 | Guterman et al. |
| 5,747,359 | A | 5/1998 | Yuan |
| 5,751,038 | A | 5/1998 | Mukherjee |
| 5,756,385 | A | 5/1998 | Yuan |
| 5,786,988 | A | 7/1998 | Harari |
| 5,847,425 | A | 12/1998 | Yuan |
| 5,867,429 | A | 2/1999 | Chen |
| 5,883,409 | A | 3/1999 | Guterman |
| 5,965,913 | A | 10/1999 | Yuan |
| 5,999,448 | A | 12/1999 | Kurihara |
| 6,028,336 | A | 2/2000 | Yuan |
| 6,046,935 | A | 4/2000 | Takeuchi et al. |
| 6,058,044 | A * | 5/2000 | Sugiura et al. ........ 365/185.17 |
| 6,072,721 | A * | 6/2000 | Arase .................... 365/185.11 |
| 6,103,573 | A | 8/2000 | Harari |
| 6,151,248 | A | 11/2000 | Harari |
| 6,180,457 | B1 | 1/2001 | Shin et al. |
| 6,208,545 | B1 | 3/2001 | Leedy |
| 6,222,762 | B1 | 4/2001 | Guterman et al. |
| 6,235,586 | B1 | 5/2001 | Au |
| 6,258,665 | B1 | 7/2001 | Shimizu |
| 6,281,075 | B1 | 8/2001 | Yuan et al. |
| 6,295,227 | B1 | 9/2001 | Sakui et al. |
| 6,391,717 | B1 | 5/2002 | Shin et al. |
| 6,403,421 | B1 | 6/2002 | Ikeda et al. |
| 6,417,538 | B1 | 7/2002 | Choi |
| 6,512,263 | B1 | 1/2003 | Yuan |
| 6,529,410 | B1 | 3/2003 | Han et al. |
| 6,614,684 | B1 | 9/2003 | Shukuri |
| 6,624,464 | B2 | 9/2003 | Shin et al. |
| 6,762,092 | B2 | 7/2004 | Yuan |
| 6,768,161 | B2 | 7/2004 | Kinoshita |
| 6,770,932 | B2 | 8/2004 | Himeno |
| 6,801,095 | B2 | 10/2004 | Chen et al. |
| 6,806,132 | B2 | 10/2004 | Mori et al. |
| 6,807,095 | B2 | 10/2004 | Chen et al. |
| 2001/0001491 | A1 | 5/2001 | Sakui |
| 2002/0093073 | A1 | 7/2002 | Mori et al. |

OTHER PUBLICATIONS

Y. Takeuchi et al., "A Self-Aligned STI Process Integration for Low Cost and Highly Reliable 1Gbit Flash Memories," *1998 Symposium on VLSI Technology—Digest of Technical Papers*, Jun. 9-11, 1998, pp. 102.

Seiichi Aritome, "Advanced Flash Memory Technology and Trends for File Storage Application," *2000 International Electron Devices Meeting*, Dec. 10-13, 2000, pp. 33.1.1-33.1.4.

Aritome et al., "A Novel Side-Wall Transfer-Transistor Cell (SWATT Cell) For Multi-Level NAND EEPROMs", 1995 IEEE International Solid-State Circuits Conference, IEDM 95, pp. 275-278.

Aritome et al., "A0.67um2 Self-Aligned Shallow Trench Isolation Cell (SA-STI CELL) for 3V-only 256Mbit NAND EEPROMs", IEDM Technical digest, pp. 61-64 (1994).

Cho et al., "A Dual-Mode NAND Flash Memory: 1-Gb Multilevel and High-Performance 512-Mb Single-Level Modes", IEEE Journal of Solid-State Circuits, vol. 36, No. 11, pp. 1700-1706 (2001).

Lee et al., "Effects of Parasitic Capacitance on NAND Flash Memory Cell Operation," *IEEE Non-Volatile Semiconductor Memory Workshop*, Aug. 12th-16th, pp. 90-92.

Y. Takeuchi et al., "A Self-Aligned STI Process Integration for Low Cost and Highly Reliable 1Gbit Flash Memories," *1998 Symposium on VLSI Technology-Digest of Technical Papers*, Jun. 9-11, 1998, pp. 102.

Seiichi Aritome, "Advanced Flash Memory Technology and Trends for File Storage Application," *2000 International Electron Devices Meeting*, Dec. 10-13, 2000, pp. 33.1.1-33.1.4.

Aritome et al., "A Novel Side-Wall Transfer-Transistor Cell (SWATT Cell) For Multi-Level NAND EEPROMs", 1995 IEEE International Solid-State Circuits Conference, IEDM 95, pp. 275-8.

Aritome et al., "A0.67um2 Self Aligned Shallow Trench Isolation Cell (SA-STI CELL) for 3V-only 256Mbit NAND EEPROMs", IEDM Technical digest, pp. 61-64 (1994).

Cho et al., "A Dual-Mode NAND Flash Memory: 1-Gb Multilevel and High-Performance 512-Mb Single-Level Modes", IEEE Journal of Solid-State Circuits, vol. 36, No. 11, pp. 1700-1706 (2001).

Lee et al., "Effects of Parasitic Capacitance on NAND Flash Memory Cell Operation," *IEEE Non-Volatile Semiconductor Memory Workshop*, Aug. 12th-16th 2001, pp. 90-92.

* cited by examiner

DEEP WORDLINE TRENCH TO SHIELD CROSS COUPLING BETWEEN ADJACENT CELLS FOR SCALED NAND

CROSS REFERENCE TO RELATED APPLICATIONS

This application is a continuation of U.S. patent application Ser. No. 10/353,570, filed Jan. 28, 2003, now U.S. Pat. No. 6,898,121; which is a continuation-in-part of U.S. patent application Ser. No. 10/175,764, filed Jun. 19, 2002 now U.S. Pat. No. 6,894,930. This application is also related to U.S. Pat. No. 5,867,429 entitled "High Density Non-Volatile Flash Memory Without Adverse Effects of Electric Field Coupling Between Adjacent Floating Gates" which is hereby incorporated by this reference in its entirety.

BACKGROUND OF THE INVENTION

1. Field of the Invention

This invention relates generally to flash electrically erasable and programmable read only memory (EEPROMS), and more specifically to NAND flash memory with a high memory cell density.

2. Related Art

Most existing commercial flash EEPROM products operate each memory cell with two ranges of threshold voltages, one above and the other below a breakpoint level, thereby defining two programmed states. One bit of data is thus stored in each cell, a 0 when programmed into one state and a 1 when programmed into its other state. A chunk of a given number of bits of data is programmed at one time into an equal number of cells. The state of each cell is monitored during programming so that application of programming voltages stops when the threshold level of an individual cell is verified to have moved within the range that represents the value of the bit of data being stored in the cell.

In order to increase the amount of data stored in a flash EEPROM system having a certain number of storage cells, the individual cells are operated with more than two threshold level states. Preferably, two or more bits of data are stored in each cell by operating the individual cells with four or more programmable states. Three threshold breakpoint levels are necessary to define four different threshold states. Such a system is described in U.S. Pat. Nos. 5,043,940 and 5,172,338, which are hereby incorporated by this reference in their entirety. In multi-state operation, an available operating voltage range of the individual cells is divided into an increased number of states. The use of eight or more states, resulting in storing three or more bits of data per cell, is contemplated. The voltage range of each state necessarily becomes smaller as the number of states is increased. This leaves less margin within each state to accommodate any error that might occur during operation of the memory system.

One type of error is termed a "disturb," wherein electrons are unintentionally added to or taken away from a floating gate during operation of the memory. One source of a disturb is the presence of a leaky oxide dielectric positioned between the floating gate and another conductive gate of a cell. The charge level programmed onto a floating gate of a cell changes when such a leaky oxide is present, thus leading to the possibility that the state of the cell will be incorrectly read if the change in charge has been large enough. Since few to no errors can be tolerated in a mass digital data storage system, a sufficient margin for this error is provided by making the voltage range allocated to each state sufficient to include an expanded range of voltages that can occur as the result of such disturbs. This necessarily limits the number of states that can be included in a multi-state flash EEPROM system since the total available voltage range is limited.

Another type of error is termed the "Yupin effect." The Yupin effect occurs when the neighboring cell of a selected cell is programmed after the selected cell itself is programmed, and the charges of the neighboring cell influence the voltage of the selected cell. Any potential present in an adjacent cell or string may influence the reading of a selected cell, including those in the channel, floating gate, or control gates etc. . . . Such interference from the subsequently programmed neighbor cell distorts the voltages of the selected cell, possibly leading to an erroneous identification of its memory state during reading.

SUMMARY OF THE INVENTION

The present invention is an improved structure for high density NAND type flash memory that minimizes the effect of disturbs and Yupin effect errors.

One aspect of the invention is a NAND flash memory device formed from a substrate. The device comprises strings of transistors. Each string has a first select gate, a plurality of floating gates, and a second select gate. The floating gates are formed between shallow trench isolation areas and wordlines extend across adjacent strings and extend between the floating gates into the shallow trench isolation areas thereby isolating adjacent floating gates. The wordlines shield a selected floating gate from the potentials, and from variations in the potentials of adjacent memory cells and components. The electric fields may emanate from a component located anywhere near the selected floating gate, for example above or below or at a diagonal.

Another aspect of the invention is a flash memory device formed from a substrate. The device comprises strings of adjacent transistors of a NAND architecture comprising a first select gate, a plurality of floating gates, and a second select gate, the plurality of floating gates formed above the substrate, wherein the strings are separated by shallow trench isolation areas. The device has two or more discrete programming levels programmed by increasing a programming potential until the levels are reached, wherein once the floating gates have reached a steady state a linear increase in programming potential results in an approximately linear increase in floating gate charge given a constant potential surrounding environment. Wordlines extend across adjacent strings and between the floating gates into the shallow trench isolation areas, such that when a floating gate of a selected string is read or verified, the wordline minimizes deviation from the linear increase due to voltage variations in the surrounding environment.

The present invention is better understood upon consideration of the detailed description below, in conjunction with the accompanying drawings of illustrative embodiments of the invention.

DETAILED DESCRIPTION OF THE INVENTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

Figure 1A:
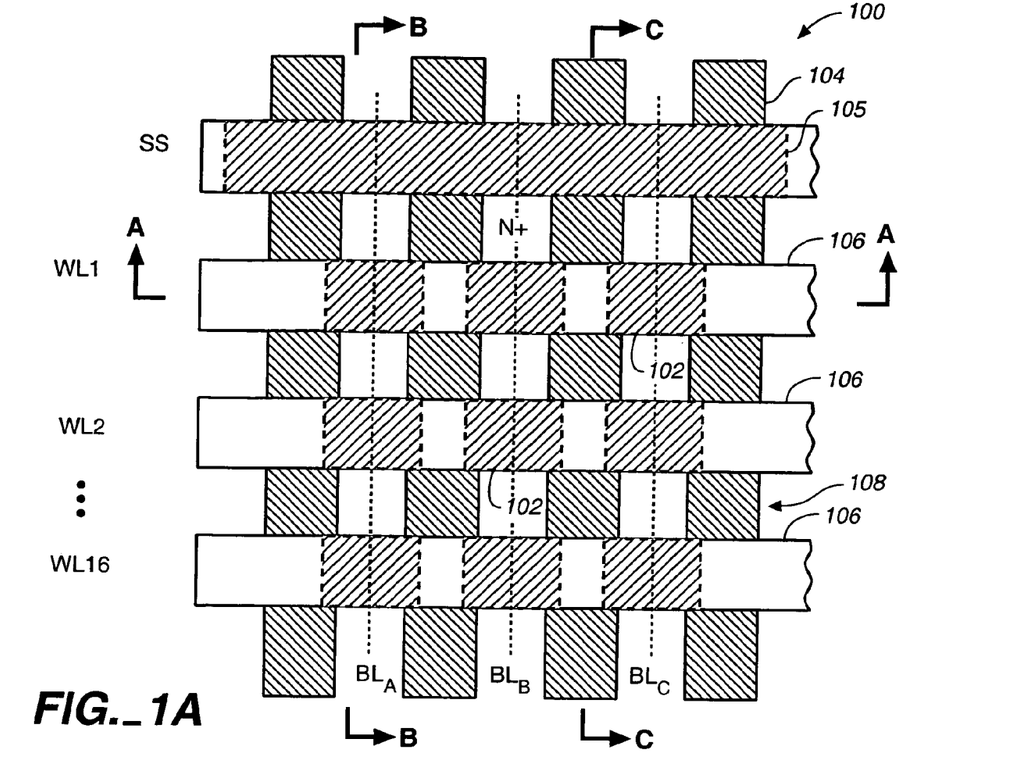
FIG. 1A is a plan view of the structure of memory array 100.
Figure 1B:
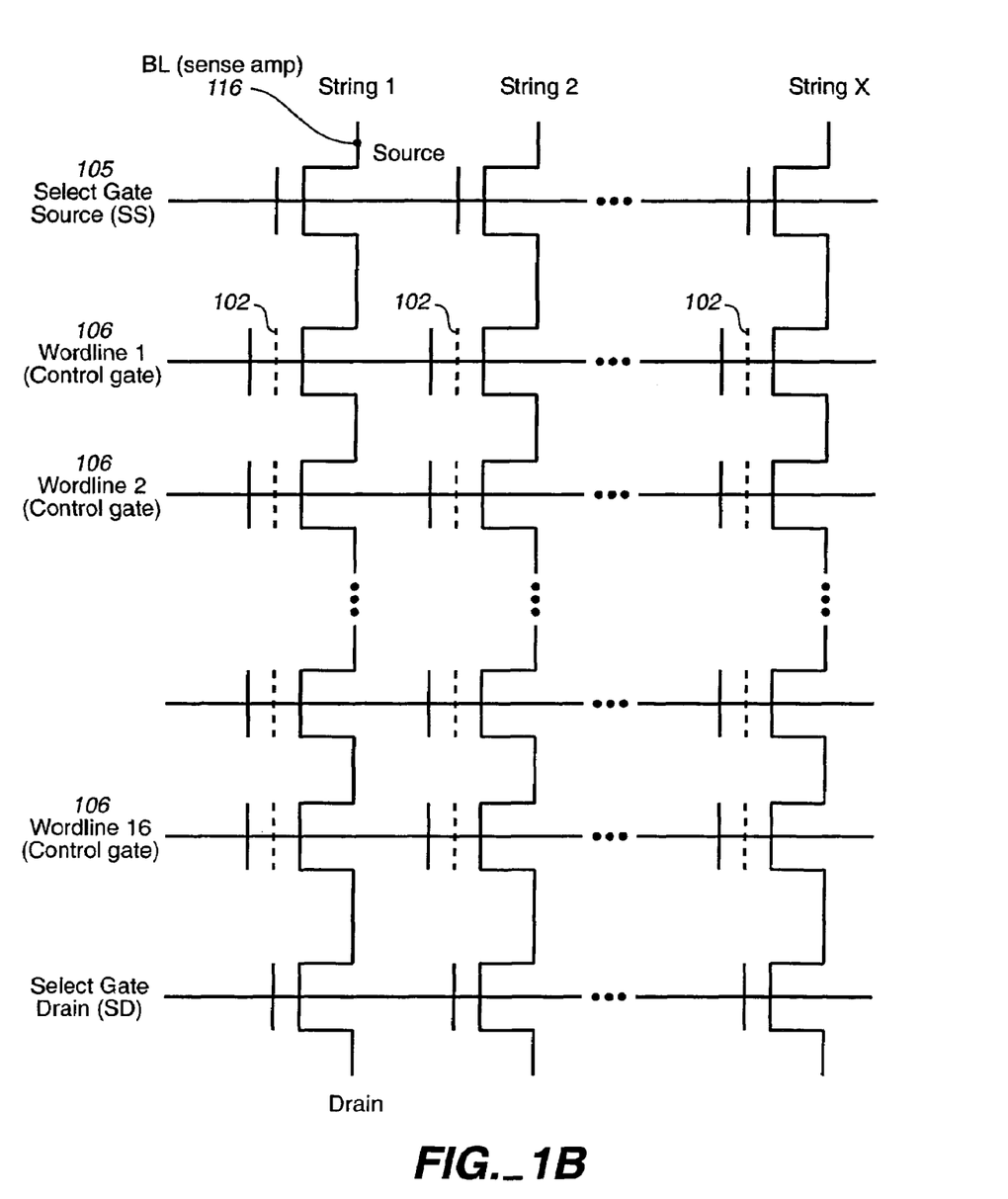
FIG. 1B is an electrical circuit diagram corresponding to the structure of FIG. 1A.
Figure 2:
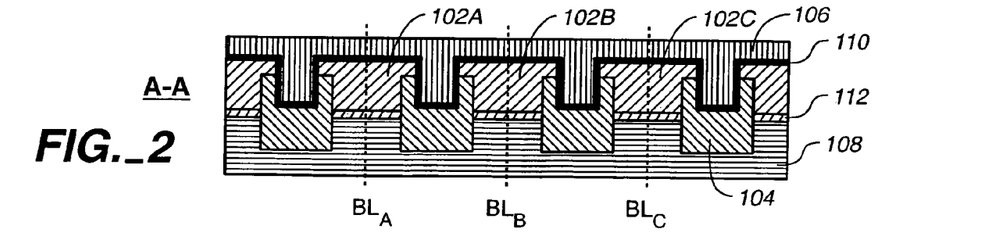
FIG. 2 is a cross section of memory array 100.
Figure 3:
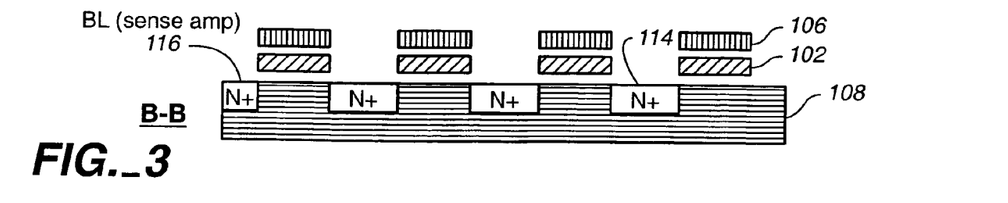
FIG. 3 is a cross section of memory array 100.
Figure 4:
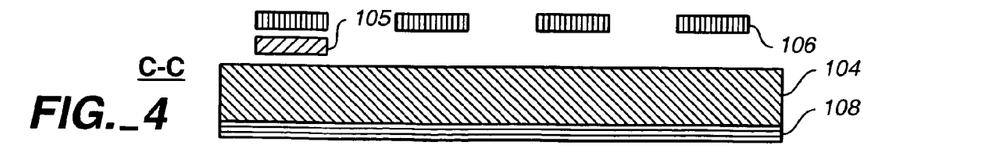
FIG. 4 is a cross section of memory array 100.

FIG. 1A illustrates a plan view of an embodiment of the NAND flash memory of the present invention. FIGS. 2–4 are cross sections taken through the structure shown in FIG. 1A. An electrical equivalent circuit of the memory array is given in FIG. 1B, wherein common elements within the structure of FIGS. 1A and 2–4 are identified by the same reference character.

Parallel wordlines 106 connect adjacent NAND strings of floating gates 102. The wordlines 106 are illustrated horizontally, and the strings are illustrated vertically in the figures. A NAND string generally includes a select gate followed by several floating gates and another select gate. The bitline A, B, and C ($BL_A$, $BL_B$, $BL_C$) locations correspond to the string locations in the plan view, although the bitlines are generally located in another plane. The circuit diagram of FIG. 1B most clearly shows the vertical array of strings. In this case sixteen floating gates and thus sixteen wordlines are illustrated per string, however, the number of floating gates may be thirty-two or more, and is foreseen to increase in the future. Floating gates 102 are isolated from adjacent floating gates by isolation trenches 104. Isolating trenches 104 are also referred to as shallow trench isolation areas. The select gate line 105 on the source side ("SS") is continuous between trenches 104, as can be seen in section C—C of FIG. 4. It is not etched into individual floating gates. At the end of the wordline 106 above SS 105, each NAND string is electrically connected to SS 105 with a via, most easily seen in FIG. 1B an FIG. 3.

Metal bitlines 116 (only one of which is shown for the sake of clarity) connect to the N+ regions 114 within substrate 108 to sense amplifiers for reading the charge stored in the floating gates 102. Thus, to read a particular floating gate a string is selected via the bitline and a wordline is also selected. The metal bitlines are generally, but not necessarily, formed in a conductive layer insulated from the wordlines. At the end of each string is another select gate coupled to the drain ("SD"). The drain and source can be interchanged in some configurations and more than 16 transistors can also be present in each string, thus also increasing the number of wordlines.

As seen in FIG. 2, there is a portion of gate oxide 112 between each floating gate 102 and the substrate 108. A dielectric material 110 separates the wordlines 106 from the floating gates 102 and the isolation trenches 104. Adjacent floating gates 102 are isolated from other floating gates in the same wordline, not only by isolating trenches 104, but also by wordlines 106. Wordlines 106 extend down between floating gates into isolation trenches 104, until, within, or past the level of gate oxide layer 112. This has several distinct benefits.

It reduces Yupin effects between adjacent cells in the wordline direction. Also, it improves the cell coupling ratio between the wordlines and the floating gates. The portion of the wordline that extends into the isolation trenches, to or past the depth of the floating gates, increases the overlap of the surface areas and volumes of the wordlines and floating gates. This increased overlap results in better coupling when a charge is read or stored during program, read, or erase operations.

The electrical field across the dielectric layer 110 between adjacent floating gates is reduced, therefore reducing any leakage current through the dielectric layer that may occur as a result of the electrical field. The lesser the electrical field, the lesser the leakage current between two adjacent floating gates. Additionally, the leakage current path is greatly increased by the extended wordlines 106. Any leakage current must travel down and around the extended portion of the wordlines and then back up or over to the adjacent floating gates. The charge level programmed onto a floating gate of a cell changes when such a leakage current is present. Therefore, by minimizing the leakage current, and thus any change in charge of the floating gates, an increased number of levels can be discerned more reliably. This leads to a higher capacity, more cost efficient, and more reliable data storage system.

Additionally, the extended wordline shields a selected floating gate from field effects of nearby channels. In certain program, read, and verify operations, a floating gate that has been programmed with a particular charge may, in a subsequent read or verify operation, indicate that it has a larger charge than it should due to a potential or charge in an adjacent channel. This is especially true with complicated program, read, and verify operations in multi-state NAND flash memory where multiple operations are occurring simultaneously in adjacent strings and cells. In many prior systems, every other cell along one row is part of the same page; in newer systems, every cell along one row can be part of the same page. Referring again to FIG. 2, this would mean that in a prior system, the floating gate 102A activated by $BL_A$ and the floating gate 102C activated by $BL_C$ would be programmed while the floating gate 102B activated by $BL_B$ is not programmed. In newer systems, every cell along one row can be part of the same page. Thus, as seen in FIG. 2, floating gate 102A of the string activated by $BL_A$ may be undergoing a programming operation at the same time as floating gate 102B. This will be discussed in further detail later in reference to FIGS. 5D and 5E. In this way, twice the number of cells may be programmed and or verified at the same time. Although this may be efficient, it results in additional field effect problems during all of the various operations involved in data storage operations.

The relationship between the distribution and the incremental voltage of the programming pulses holds true only if the potential of any other coupling element to the floating gates of the cells being programmed remains constant. In the case of programming adjacent NAND strings, an adjacent (substrate) channel of an adjacent cell may be at a low potential, for instance 0V, for a number of programming pulses while it is being programmed and then suddenly be boosted or "locked out" for subsequent programming pulses to a high potential, for instance, 5, 7.5, or 10 V, after it verifies in order to stop further programming or for any other reason. This boosting of the channel potential also increases the floating gate potential of the adjacent cell. Thus, both the adjacent channel and adjacent floating gate will couple a higher potential to the selected cell for the next programming pulse which may broaden the width of the programmed distribution. This has a number of negative consequences, some of which may include error in reading a particular bit and reduction in the total number of bits of data that may be stored in a given die size. An example of some programming details is illustrated in FIGS. 5A–5E which will be discussed below. The levels given are illustrative and only serve to educate the reader on the operation of an example memory system with which the present invention may be particularly advantageous.

For further information regarding the data storage operations, please refer to. U.S. patent application Ser. No. 09/893,277, filed Jun. 27, 2001, entitled "Operating Techniques For Reducing Effects Of Coupling Between Storage Elements Of A Non-Volatile Memory Operated In Multiple Data States," hereby incorporated by this reference in its entirety, and an article entitled "Fast and Accurate Programming Method for Multi-level NAND EEPROMs", pp. 129–130, *Digest of* 1995 *Symposium of VLSI Technology*, which is also hereby incorporated by this reference in its entirety, and discusses the timing and voltage levels of programming pulses using in the read/verify and programming operations.

Figure 5A:
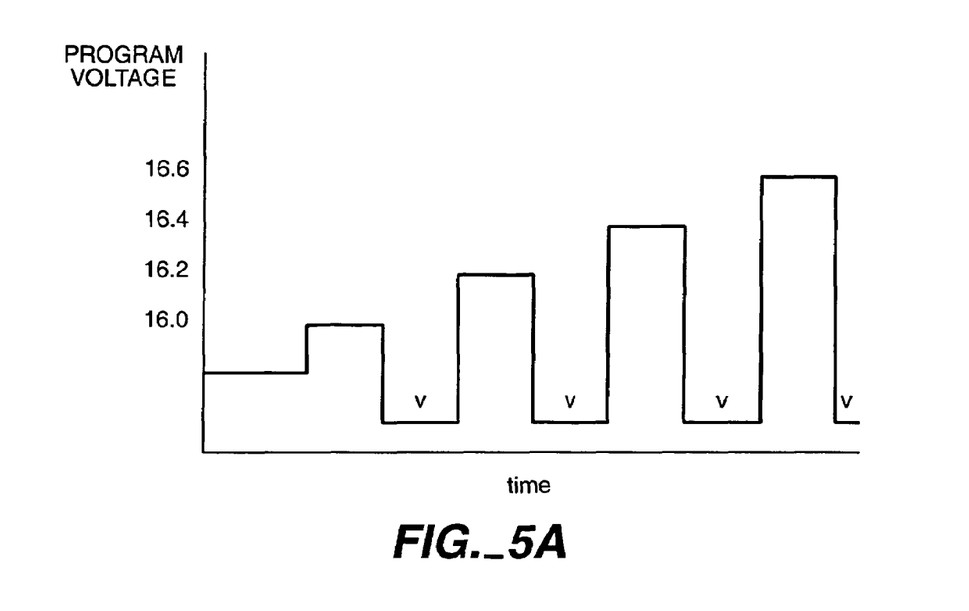
FIG. 5A is a plot of program voltage vs. time during a program operation.

An example of the incremental voltage steps of the programming pulses are shown in FIG. 5A. In the example shown and described, the pulses are incremented by 0.2 volts. After each pulse, there is a verify cycle, followed by an incrementally higher voltage pulse. This takes place until a desired or threshold voltage is verified in the floating gate. For example, this may take place until the floating gate is verified at 2.0 volts.

Figure 5B:
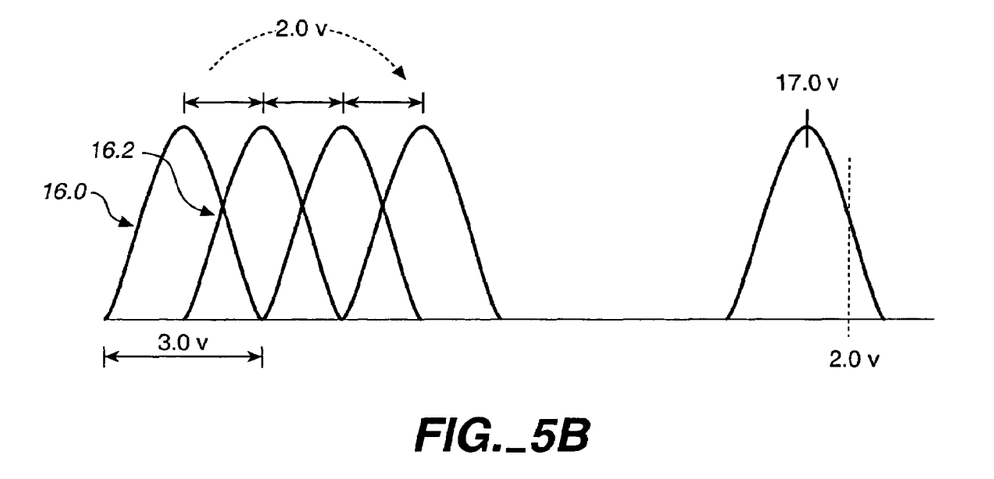
FIG. 5B is a plot of the voltage distribution of programming steps.

FIG. 5B illustrates that for each program pulse, there is a distribution of the charge stored in the floating gates. For example, with the first pulse of 16.0 volts, the distribution of the verified charges is about three volts. So, if it is desired to store 2.0 volts on the floating gate, it may be necessary to increment up to 17.0 volts and higher in the control gate or wordline. If, for example, after a 17.0 volt programming pulse the distribution of stored charges on the floating gates is such that there are some floating gates above and some below the 2.0 V threshold, those below will receive a further programming while those above the threshold will not by having their channel boosted or "locked out."

Figure 5C:
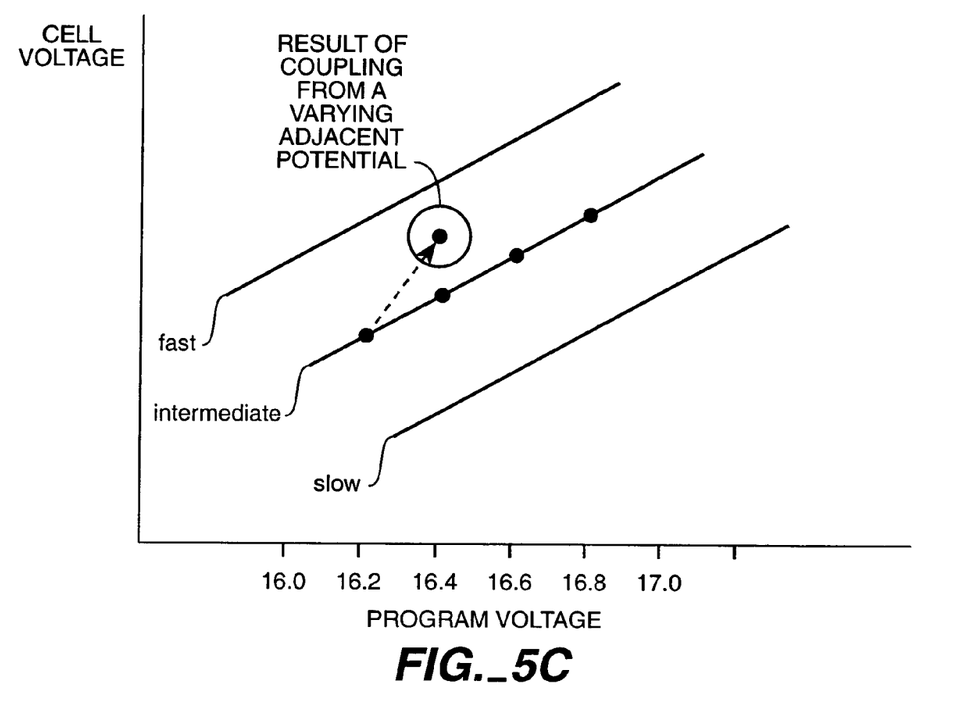
FIG. 5C is a plot of cell voltage vs. program voltage.

With a constant environment, i.e. one where the potential and electric field of the neighboring components is constant, the programming pulses, will, after having reached a steady state, result in a predictable and approximately linear increase in the cell voltage ($V_t$), as seen in FIG. 5C. As seen in the nearly parallel lines, some "fast" floating gates may reach the desired verify $V_t$ at a lower program voltage than other "slow" or "intermediate" floating gates. Once the steady state has been reached, it can be seen that a linear increase in the program voltage results in a nearly linear increase in $V_t$.

Therefore, if, for example, a cell has a $V_t$ of 1.99 volts it will receive another programming pulse to take it above the 2.0 volt threshold. In a constant environment, the cell should then have a $V_t$ of 2.19 volts. However, if there is any deviation of the voltage or electric field that is applied to the cell, for example between one programming pulse and another, the voltage stored on the cell may differ from that expected. If a neighboring component exerts an influence of the electrical field of the cell during a programming pulse, the charge stored will also deviate. For example, the cell that was at 1.99 volts in the previous verification cycle, may instead of having a $V_t$ of 2.19 volts may have a $V_t$ of 2.29 or 2.39 volts. As shown in FIG. 5C, coupling of potential from a nearby cell may cause one of the intermediate cells to deviate from the linear increase that is characteristic of the steady state. Thus, the distribution of the cells shown in FIG. 5B will increase due to any variation in the potential of adjacent components.

The increase in the distribution of cells will lessen the number of states that can be repeatably and reliably discerned in a multi-level storage system. This greatly lessens the storage capacity of a memory device with a given die size, and therefore increases the cost of production of a storage device with a desired storage capacity.

Figure 5D:
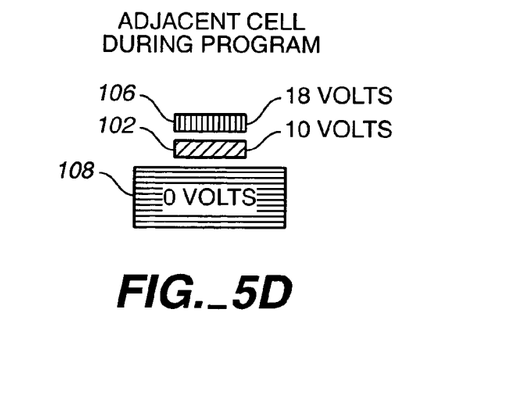
FIG. 5D is an illustration of an adjacent memory cell during a program operation.
Figure 5E:
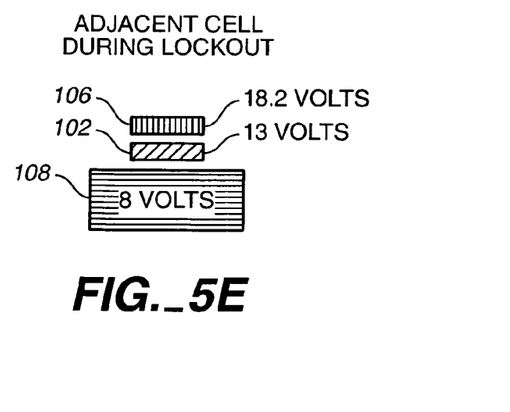
FIG. 5E is an illustration of an adjacent memory cell during lockout.

Specifically, as can be seen in FIGS. 5D and 5E, the voltages in the components of an adjacent cell will vary greatly during program and during "lockout." An adjacent cell is any cell located near another cell, in any direction, including diagonally. For example, floating gate 102A is adjacent to floating gate 102B. The active area of the cell comprises the channel area in the substrate below the floating gate and the wordline area above the floating gate. The cell may also be said to comprise portions of the shallow trench isolation area and other components. A cell is "locked out" by isolating its corresponding bitline if it has verified at the desired program voltage. In the example given above, if the cell has verified at 2.0 volts, it will be "locked out" from further programming pulses by increasing the cell voltage in the channel (substrate) to a relatively high voltage level by isolating the corresponding bitline.

FIG. 5D shows an adjacent cell during the programming operations previously discussed. The shape and configuration of the cells is simplified for ease of understanding. In the example programming operation shown, wordline 106 of the cell is at 18 volts, floating gate 102 is at 10 volts, and substrate 108 is at 0 volts. However, during lockout, as shown in FIG. 5E, wordline 106 is now at 18.2 volts, floating gate 102 is now at 13 volts, and substrate 108 is now at 8.0 volts. The channel is a portion of the substrate just below the upper surface of the substrate. While a selected cell is being programmed, an adjacent cell may be either in the program operation shown in FIG. 5D, or the lockout state shown in FIG. 5E. Furthermore, the voltages shown in the program operations vary with the different programming pulses discussed earlier. All of these voltages shown in an adjacent cell may couple to a selected cell during programming. It is the variation in these voltages that may result in the variation from steady state programming (FIG. 5C) and thus increased deviation (FIG. 5B).

Figure 6:
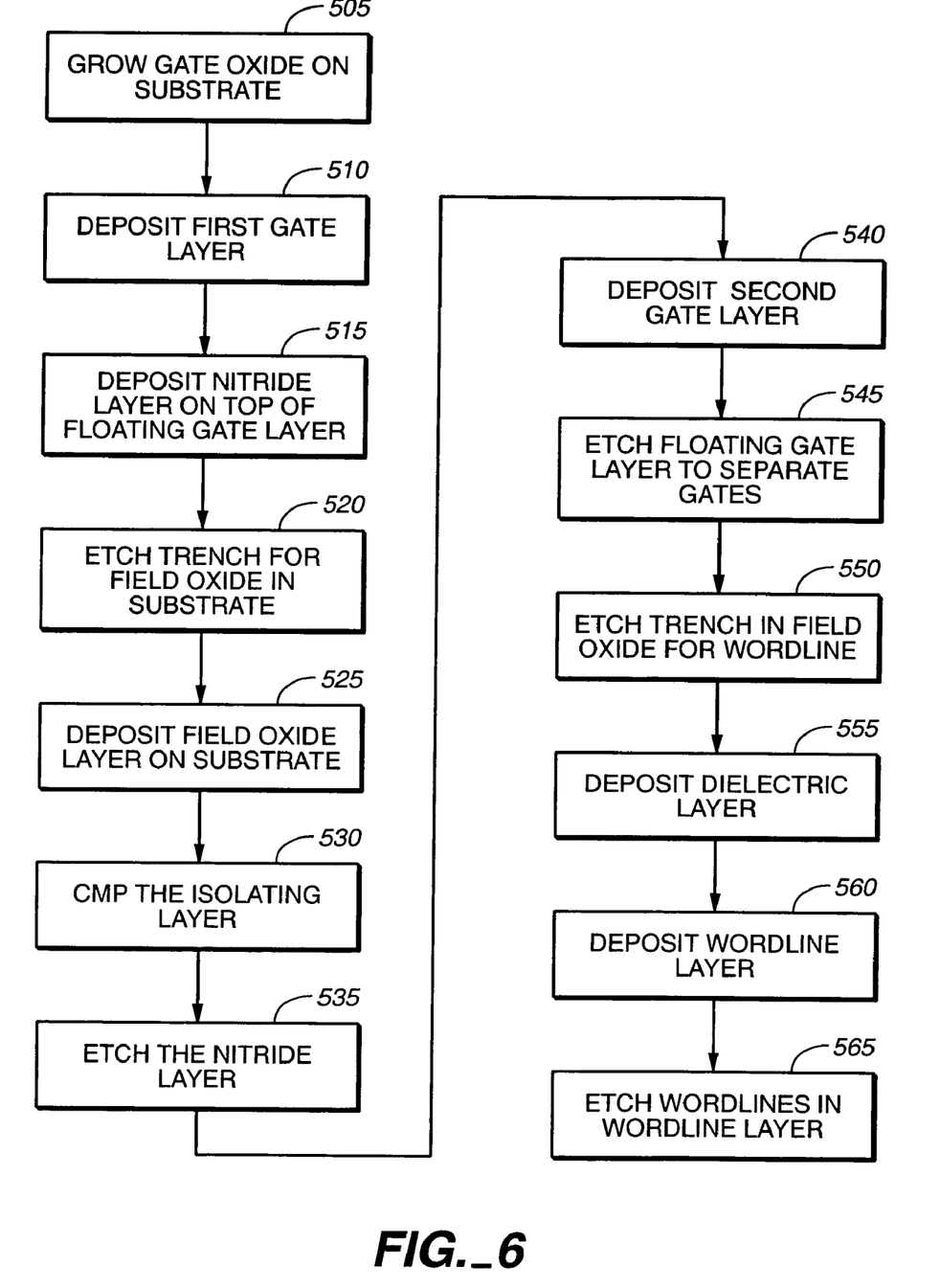
FIG. 6 is a flow chart of a method of forming an embodiment of the present invention.
Figure 7A:
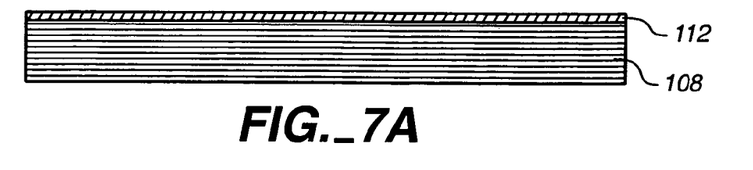
FIGS. 7A–7J are cross sections of memory array 100 at various stages during the fabrication process.
Figure 7B:
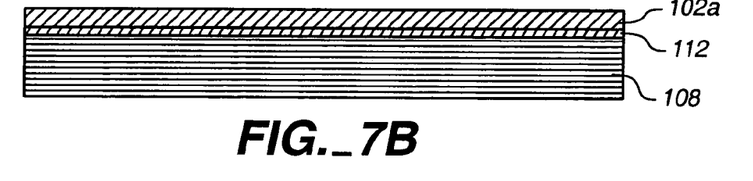
Figure 7C:
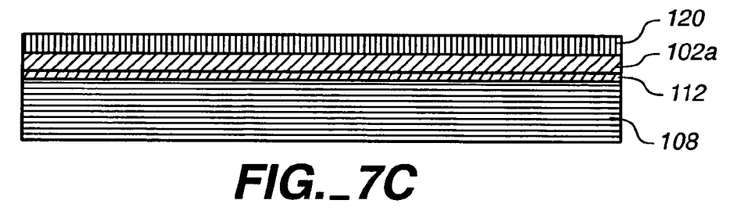
Figure 7D:
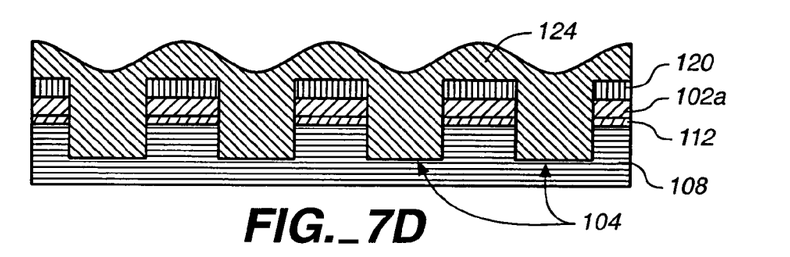
Figure 7E:
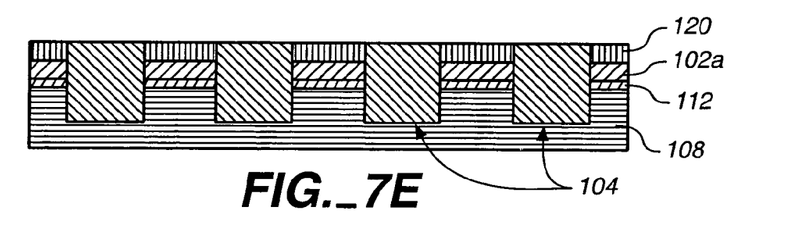

FIG. 6 is a flowchart of the steps of making memory array 100 which should be referred to in tandem with FIGS. 7A–7J. The memory array 100 is fabricated in a substrate 108. Substrate 108 preferably comprises silicon but may also comprise any material known to those in the art suclvas Gallium Arsenide etc. . . . First, a gate oxide layer 112 is formed upon substrate 108 in step 505 as seen in FIG. 7A. Gate oxide 112 is preferably grown on substrate 108 but may also be deposited. Gate oxide layer 112 preferably comprises silicon dioxide but may differ depending on what type of substrate is used and other processing factors or elements introduced during processing. For example, for CMOS applications, gate oxide 112 may comprise materials (known as ETO) including nitride/oxynitride. Next, a first gate layer 102a is deposited upon gate oxide layer 112 in step 510 as seen in FIG. 7B. The first gate layer 102a is made of semiconducting material such as polysilicon. A nitride layer 120 is then deposited upon the first floating gate layer 102a in step 515 as seen in FIG 7C. In step 520, parallel trenches are etched in substrate 108 with well known etching techniques. Generally in fabricating high density memory arrays where the features are of a very small scale, plasma etching is preferred over wet etching in order to have a precise and uniform etch. In step 525 the trenches are then filled with a field oxide, as seen in FIG. 7D, to form isolation trenches 104. The field oxide within isolation trenches 104 is preferably comprised of silicon dioxide but can be comprised of other insulating materials (including materials other than oxides). Isolation trenches 104 range from about 0.2 microns to about 0.25 microns wide and are preferably about 0.2 microns wide. The remaining field oxide 124 is removed via chemical-mechanical polishing ("CMP") in step 530, as seen in FIG. 7E.

Figure 7F:
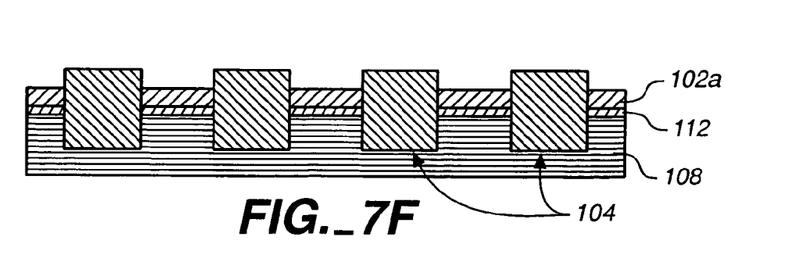
Figure 7G:
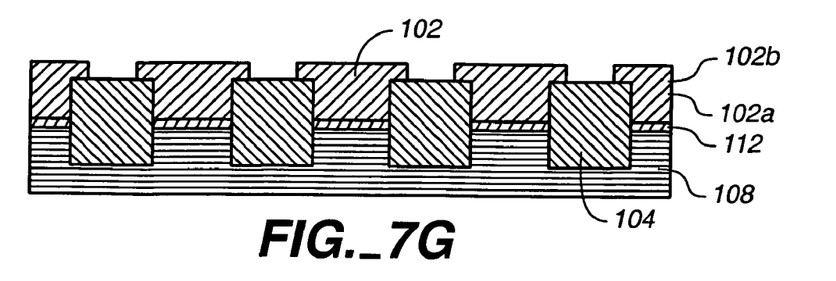

Next, in step 535, nitride layer 120 is etched away such that isolation trenches 104 extend above the surface of the first gate layer 102a, as seen in FIG. 7F. The isolating trenches 104 may extend above the substrate 108 and gate oxide layer 112 as shown, or, alternatively, may only extend up to the level of either the substrate 108, gate oxide layer 112, or first gate layer 102a, and it should be understood that differing processes and steps may be necessary to achieve these differing embodiments.

A second gate layer 102b of the same semiconducting material as the first gate layer 102a is then deposited upon the gate oxide layer 112 and isolation trenches 104 in step 540. It is then selectively etched above isolation trenches 104 to create floating gates 102 in step 545. The resultant structure can be seen in FIG. 7G. Floating gates 102 are substantially "T" shaped in order to maximize the coupling between the floating gate and the control gate, also referred to as the wordline 106 that activates the floating gate. The line between the first and second gate layers 102a and 102b has been removed for the sake of clarity. The T shape provides a large surface area between floating gate and the wordline, thus maximizing the coupling ratio between the two devices for improved read, program and erase operations. For further information, please refer to co-pending U.S. patent application Ser. No. 09/925,102 to Yuan et al., entitled "Scalable Self-Aligned Dual Floating Gate Memory Cell Array and Methods of Forming the Array," which is hereby incorporated by this reference in its entirety.

Figure 7H:
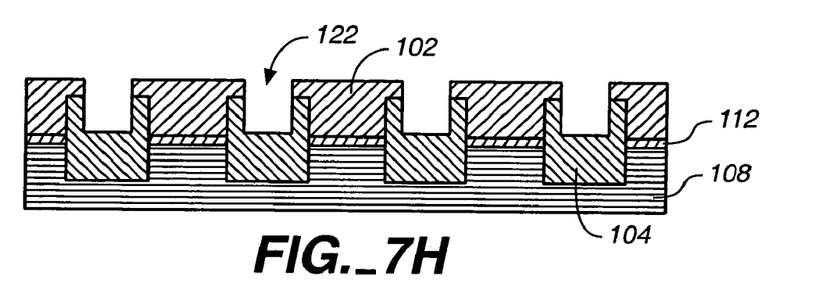
Figure 7I:
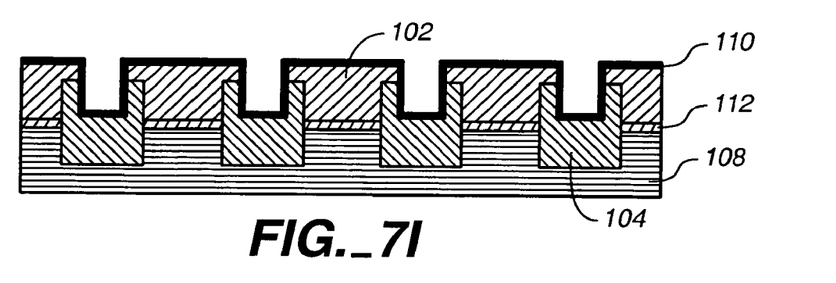
Figure 7J:
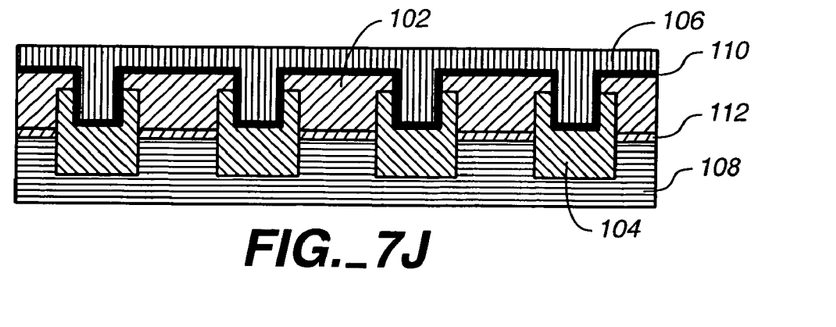

As seen in FIG. 7H, a set of parallel trenches 122 is formed within isolating trenches 104 in step 550. Trenches 122 may extend within trenches 104 to the level of the upper surface of gate oxide 112 or any distance within trenches 104 within or below the level of gate oxide 112. Isolation layer 110 is then deposited upon the floating gates 102, and within second trenches 122 in isolation trenches 104, in step 555, as seen in FIG. 7I. Isolation layer 110 is preferably a dielectric layer such as an oxide-nitride-oxide ("ONO") layer 110. The dielectric layer 110 can be any type of dielectric known in the art and is not necessarily limited to an ONO structure. A wordline layer comprising a semiconducting material layer such as polysilicon and a conductive layer such as tungsten suicide is then deposited upon dielectric layer 110 in step 560, as can be seen in FIG. 7J. Wordlines 106 are then etched from the wordline layer in step 565.

As previously mentioned, the wordlines 106 extend down between the floating gates 102 into the isolating trenches 104. This isolates adjacent floating gates 102 from each other. In the preferred embodiment, wordlines 106 extend within the isolation trenches 104 to or beyond the level of the gate dielectric 112.

The various layers can be formed and the etching steps can be performed in many different well known methods and orders, and are not necessarily done in the order described, i.e. gate oxide layer 112 may be formed before or after the parallel trenches are etched into substrate 108 etc. . . . Furthermore, additional layers, steps, and resultant structures that are not described may also be part of the process and the resultant memory array.

The extended wordline reduces the problem of the aforementioned Yupin effect because it acts as a shield between adjacent floating gates. Again, in short, the Yupin effect is when the charge stored or otherwise present in a neighboring cell influences the reading of a selected cell. The present solution shields gates to avoid or minimize Yupin effect errors caused by neighboring gates. Yupin effect errors can also be accommodated through program and read circuitry and algorithms.

The extended wordline also protects against conduction leakage between adjacent floating gates within the dielectric layer 110 because it blocks the conduction path between adjacent gates. Furthermore, any possible stringers as a result of an incomplete etch of the floating gate layer that might short circuit adjacent gates are also-eliminated in the situation where the etch within the isolation trench extends past the upper (top of the "T") portion of the T shaped floating gate. For more information on the Yupin effect and on disturbs, please refer to U.S. Pat. No. 5,867,429, which was previously incorporated by reference.

While embodiments of the present invention have been shown and described, changes and modifications to these illustrative embodiments can be made without departing from the present invention in its broader aspects. Thus, it should be evident that there are other embodiments of this invention which, while not expressly described above, are within the scope of the present invention and therefore that the scope of the invention is not limited merely to the illustrative embodiments presented. Therefore, it will understood that the appended claims set out the metes and bounds of the invention. However, as words are an imperfect way of describing the scope of the invention, it should also be understood that equivalent structures and methods while not within the express words of the claims are also within the true scope of the invention.

The invention claimed is:

1. A flash memory device formed from a substrate, the device comprising:
   a plurality of strings of transistors of a NAND architecture, each string of the plurality of strings comprising a first select gate, a plurality of floating gates, and a second select gate, the plurality of floating gates formed above channel regions in the substrate and separated from the channel regions,
   wherein adjacent first and second strings of the plurality of strings undergo programming operations at the same time, and
   wherein when programming a selected floating gate of the first string, a change in a potential of a portion of the second adjacent string is shielded from the selected floating gate of the first string by a wordline extending across adjacent strings and extending between floating gates of the first and second strings into a shallow trench isolation trench between the channel regions of the first and second strings.

2. The flash memory device of claim 1 wherein the wordline shields the selected floating gate of the first string from a potential in the substrate at the second string.

3. The flash memory device of claim 1 wherein the wordline shields the selected floating gate of the first string from a potential of the adjacent floating gate of the second string.

4. The flash memory device of claim 1 further comprising a gate oxide layer between the floating gates and the substrate, the wordline extending down past the level of an upper surface of the gate oxide layer.

5. The flash memory device of claim 1 wherein the wordline shields the selected floating gate of the first string from the potential of a floating gate of the second adjacent string.

6. A flash memory device comprising:
a plurality of strings of adjacent transistors of a NAND architecture, individual strings of the plurality of strings comprising a first select gate, a plurality of floating gates, and a second select gate, the plurality of floating gates formed above a substrate;
shallow trench isolation trenches between adjacent ones of the plurality of strings;
wordlines extending across the plurality of strings and extending between floating gates into the shallow trench isolation trenches between adjacent strings of the plurality of strings,
wherein in the case of programming adjacent strings of the plurality of NAND strings, a channel of a first string adjacent a floating gate of a second string is at a first potential for a number of programming pulses and is at a second potential during subsequent programming pulses,
wherein the potential of the channel of the first string couples to the potential of the floating gate of the second string, and
wherein the wordline shields the floating gate of the second string from the potential of the channel of the first string thereby affecting the coupling to the potential of the floating gate.

7. The flash memory device of claim 6 further comprising a gate oxide layer between the floating gates and the substrate, the wordlines extending down past the level of an upper surface of the gate oxide layer.

8. The flash memory device of claim 6 wherein the wordlines extend down past the level of an upper surface of the substrate.

9. The flash memory device of claim 6 wherein the wordlines extend down past the lower level of the channel.

10. A flash memory device formed from a substrate, the device comprising:
a plurality of strings of transistors of a NAND architecture, each string of the plurality of strings comprising a first select gate, a plurality of floating gates, and a second select gate, the plurality of floating gates formed above the substrate, a plurality of control gates, each control gate of the plurality of control gate overlying a floating gate;
the plurality of floating gates formed above a gate oxide layer formed upon cell channel regions within the substrate; and
a plurality of wordlines that extend across the plurality of strings to connect control gates of different strings and that extend between the floating gates of adjacent strings, each wordline of the plurality of wordlines extending down past an upper surface of the substrate to shield a selected floating gate during a read or verify operation from a potential present in an adjacent string.

11. The flash memory device of claim 10 wherein a wordline of the plurality of wordlines shields the selected floating gate from the potential of the substrate beneath the adjacent string.

12. The flash memory device of claim 11 wherein a wordline of the plurality of wordlines shields the selected floating gate from the potential of a channel region of the substrate beneath the adjacent string.

13. The flash memory device of claim 10 wherein a wordline of the plurality of wordlines shields the selected floating gate from a potential of a floating gate of the adjacent string.

* * * * *